United States Patent [19]
May

[11] Patent Number: 5,668,465
[45] Date of Patent: Sep. 16, 1997

[54] BATTERY VOLTAGE MONITOR AND DISCONNECTION CIRCUIT

[75] Inventor: Vincent D. May, Plano, Tex.

[73] Assignee: Operating Technical Electronics, Inc., Grand Prairie, Tex.

[21] Appl. No.: 639,476

[22] Filed: Apr. 29, 1996

[51] Int. Cl.⁶ .......................... H01M 10/46; H01M 10/48
[52] U.S. Cl. ................................ 320/39; 320/48
[58] Field of Search .................. 320/8, 9, 10, 11, 320/12, 13, 21, 30, 39, 48; 324/426, 427, 433

[56] References Cited

U.S. PATENT DOCUMENTS

| | | | |
|---|---|---|---|
| 5,111,148 | 5/1992 | Senoo et al. | 324/433 |
| 5,327,068 | 7/1994 | Lendrum et al. | 320/13 |
| 5,343,137 | 8/1994 | Kitaoka et al. | 320/13 |
| 5,451,881 | 9/1995 | Finger | 324/433 |

*Primary Examiner*—Edward Tso
*Attorney, Agent, or Firm*—Jack A. Kanz

[57] ABSTRACT

A battery saver circuit compares the battery terminal voltage to a programmable reference voltage and disconnects the battery from the load when the measured battery voltage falls below a predetermined minimum value. The reference voltage is programmable by a transfer function generator which varies the reference voltage in accordance with the current drawn by the load to account for the voltage drop in the line series wiring. A fault indicator is included to prevent chatter in the relay by raising the battery voltage necessary to reconnect the battery to the load. The fault indicator is reset when the battery is recharged.

9 Claims, 1 Drawing Sheet

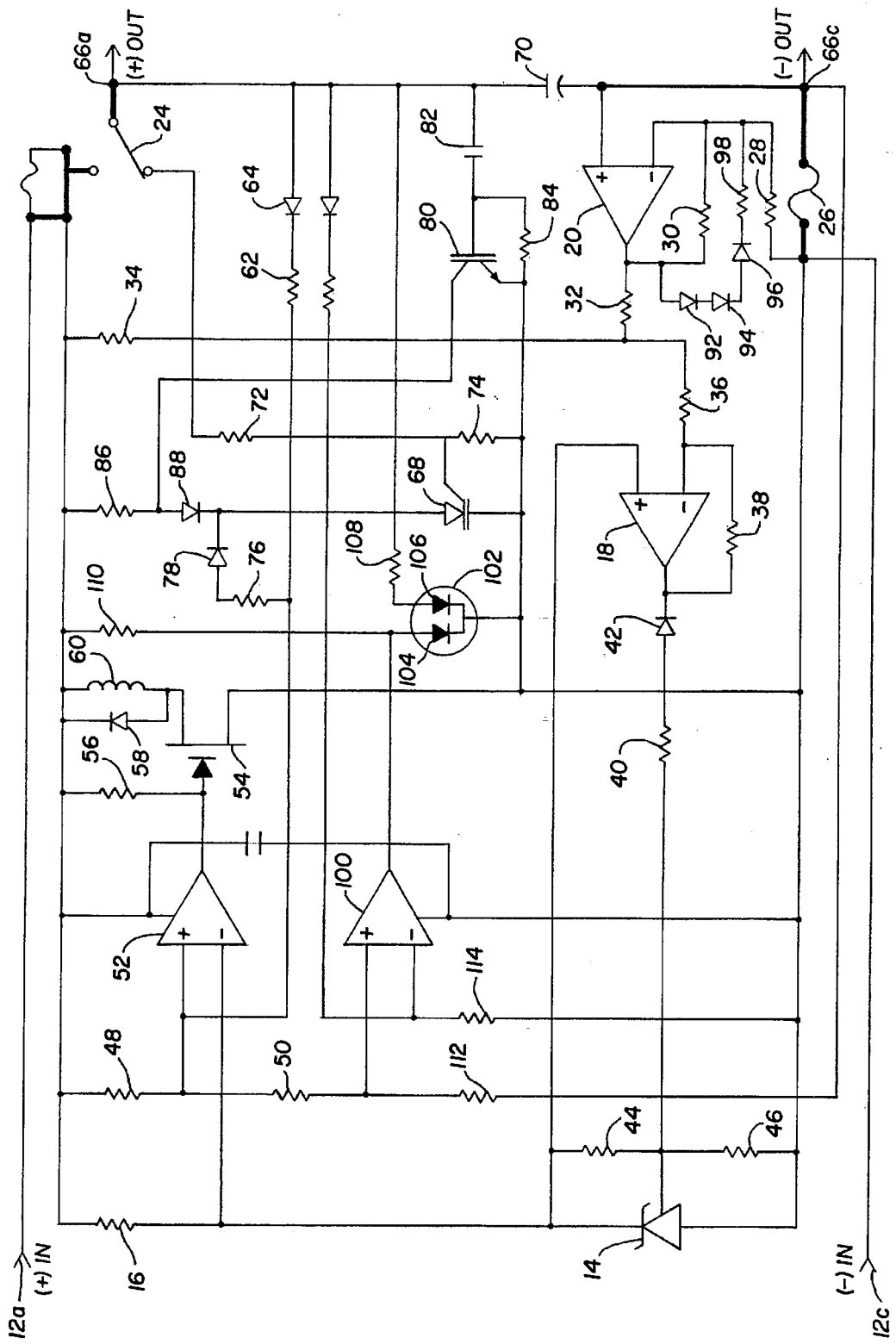

BATTERY VOLTAGE MONITOR AND DISCONNECTION CIRCUIT

This invention relates to electronic circuits for monitoring storage batteries. More particularly, it relates to circuits which monitor storage battery output voltage and disconnect the battery from the load when output voltage falls below a predetermined value.

BACKGROUND OF THE INVENTION

Excessive use of lights or accessories such as cellular phones, radios and the like without appropriate re-charging can rapidly reduce the output of a storage battery. In the case of an automobile storage battery or the like, the battery can readily be discharged to a level where it contains insufficient output energy to crank the engine. Accordingly, attempts have been made to automatically monitor battery output voltage and disconnect the battery from the load when the measured output voltage fails below a predetermined minimum level. Apparatus for this purpose (known as intelligent battery guards) are usually designed for universal applications having varying current requirements and have especially poor performance histories. One reason for most failures is the simplistic designs of the previous devices. Another reason is the inaccurate assumption that the voltage measured at the accessory port (usually a cigarette lighter socket) is an accurate measure of the battery's discharge condition. The most accurate measure of battery condition is accomplished by measuring the specific gravity of the electrolyte. However, this is not practical in many cases and not physically possible with sealed batteries.

SUMMARY OF THE INVENTION

In accordance with the present invention, a circuit is provided which monitors battery terminal voltage under load conditions. When the circuit determines that the battery has reached a predetermined minimum level (such as the minimum storage capacity required to crank the engine of a vehicle in which it is installed) the load is disconnected from the battery. Furthermore, the load is not reconnected until a predetermined event (such as engine restart occurs). The load, of course, may be reconnected when the battery voltage is found by the circuit to be above the predetermined minimum level.

The apparatus of the invention develops a reference voltage to which battery voltage can be compared. The reference voltage is programmable by a transfer function generator which makes the reference voltage proportional to the load current to account for voltage drops, in wiring and other components. When the battery voltage (as determined by a comparator in the circuit) is found to be below the predetermined minimum voltage level represented by the programmable reference voltage, a relay disconnects the battery from the load. Further discharge is thus prevented.

In the preferred embodiment the programmable reference voltage generator is a programmable zener diode and the transfer function generator by a current to voltage converter and an inverting amplifier. The current to voltage converter generates a voltage proportional to the current drawn by the load. This voltage is fed to the inverting amplifier which acts to alter the value of a voltage divider which sets the reference voltage generated by the zener diode.

The preferred embodiment also includes a visible status indicator of the state of the battery saver circuit. The visible status indicator is formed by a dual output light emitting diode (LED) which has both a red and a green light. The red and the green lights are used individually or in combination to indicate (i) the battery voltage is above the predetermined minimum level and the load is not drawing current; (ii) the battery voltage is above the predetermined minimum level and is drawing current; or (iii) the battery has been disconnected from the load because battery voltage is below the predetermined minimum level.

To prevent relay chatter, the battery saver circuit is preferably provided with a fault indicator which raises the voltage of the battery necessary to reconnect the load. The fault indicator in the preferred embodiment is a thyristor which latches on when the battery is disconnected from the load to place a resistor in parallel with the input voltage divider for the measured battery voltage. This raises the battery voltage required to reconnect the battery to the load while the fault indicator is "on". The fault indicator may be reset by engine restart and reconnecting the battery to the load.

BRIEF DESCRIPTION OF THE DRAWING

Other features and advantages of the invention will become more readily understood from the following detailed description taken in conjunction with the appended claims and accompanying drawing wherein the sole figure is a circuit diagram of the preferred embodiment of an intelligent battery guard circuit employing the invention.

DESCRIPTION OF THE PREFERRED EMBODIMENT

A circuit diagram of the preferred embodiment of the battery saver circuit of the invention is illustrated at 10 in the drawing. All parts shown readily available are standard electrical components. The anode and cathode of the battery to be monitored are connected to anode input 12a and cathode input 12c, respectively. The input voltage is connected to circuit 10 through relay switch 24 which also connects the battery to the load through output anode 66a and output cathode 66c. (The heavy lines at the output indicate high current traces necessary to handle the currents drawn by the load.)

Zener diode 14 is connected across the battery terminal through resistor 16 and is used to set an accurate programmable voltage reference against which the battery input voltage can be compared. This reference voltage can be modified by a transfer function which is set by op-amps 18 and 20. Op-amps 18 and 20 provide a control voltage which controls the voltage drop across zener diode 14. The control voltage is proportional to the current through fuse 26 as the current varies.

Op-amp 20 acts as a current to voltage converter which converts the current through fuse 26 to a voltage with the gain function of op-amp 20 set by resistors 28 and 30 when small currents are flowing through fuse 26. When sufficient current flows through fuse 26, diodes 92, 94 and 96 become forward biased and resistor 98 is placed in parallel with resistor 28, thereby altering the gain of op-amp 20. Resistor 30 is connected between cathode input 12(c) and the negative input of op-amp 20. Resistor 28 is connected between the negative input of op-amp 20 and the battery cathode to set the gain of op-amp 20. Resistors 32 and 34 are connected between anode input 12a and the output of op-amp 20 and initialize the reference voltage modification to approximately a level representing a zero current flowing in fuse 26.

Op-amp 18 acts as an inverting amplifier to amplify the voltage provided by op-amp 20. The gain of op-amp 18 is set by resistors 36 and 38. Resistor 40 is connected between the output of op-amp 18 through diode 42, and zener diode 14. Resistor 40 modulates the rate and range of the reference voltage generated by zener diode 14. Resistors 44 and 46 form a voltage divider which, in conjunction with resistor 40, controls the voltage used to modulate the drop across zener diode 14.

Comparator 52 compares the reference voltage across zener diode 14 with the battery voltage. Resistors 48 and 50 are connected to the positive input of comparator 52 and act as a voltage divider for the battery voltage to provide an accurate scaled input to comparator 52. The reference voltage is connected to the negative terminal of comparator 52. The output of comparator 52 and pull-up resistor 56 are connected to the base of transistor 54. Transistor 54 is connected in series with relay coil 60 across anode input 12a and cathode input 12c and to control relay coil 60. Diode 58 is connected in parallel with relay coil 60 between anode input 12a and the collector of transistor 60. Resistor 62 (in series with diode 64) is connected to the positive input of comparator 52 to provide hysterisis feedback and prevent chatter due to voltage noise.

To latch the circuit in the "on" state when relay coil 60 has disconnected the load from the battery, thyristor 68 is connected to capacitor 70 through resistor 72. Discharging of capacitor 70 latches thyristor 68 "on" which brings resistor 76 and diode 78 in parallel with resistor 50. Resistor 76 in parallel with resistor 50 alters the voltage divider arrangement formed by resistors 48 and 50 to input the voltage associated with the battery to comparator 52, thus raising the voltage needed to reconnect the battery to the load.

Transistor 80, which has resistor 84 connected between its base and emitter and is connected to output anode 66a through capacitor 82, operates to unlatch thyristor 68 when the battery is reconnected to the load by restarting the car, and thereby allowing the alternator to charge the battery. When the relay coil reconnects the load, transistor 80 is turned "on" through capacitor 82. When transistor 80 is "on" it shorts resistor 76 by connecting resistor 86 and diode 88 directly to ground. Shorting resistor 76 drops the current through thyristor 68 to essentially zero, thereby unlatching thyristor 68.

Dual output light emitting diode 102 usually indicates the various states of battery saver circuit 10. Dual output LED 102 contains both a red light 104 emitter and a green light 106 emitter. Green light 106 only is used to indicate that the battery is in safe condition and the load is not drawing current. Green light 106 and red light 104 are "on" at the same time to indicate that the battery is in safe condition and the load is drawing current. Red light 104 only indicates that the battery is in an unsafe condition and no load is connected.

Comparator 100 monitors the current through fuse 26. Resistors 112 and 114 are connected to the respective inputs of comparator 100 and set the minimum current necessary to activate comparator 100. When the minimum current is exceeded, comparator 100 turns "on" and activates red light 104 of dual output light emitting diode 102. When relay switch 24 is connecting the battery to the load, green light 106 is connected to battery anode 12a through resistor 108 and is, therefore, turned "on". If the battery has been disconnected from the load by relay coil 60, red light is connected to battery anode 12a through resistor 110 and is "on", indicating that the battery has been disconnected from the load. (Green light 106 is disconnected from the battery and is necessarily "off").

Battery saver circuit 10 is designed to protect a battery by disconnecting any external load in series with circuit 10 at a point before the battery is discharged to such a level as to prevent restart of a vehicle engine. Circuit 10 is also designed to provide visual indications via dual output LED 102. An accurate programmable reference voltage is set by zener diode 14 which is fed, along with the battery voltage scaled by the voltage divider formed by resistor 48 and 50, to comparator 52. When comparator 52 finds the scaled voltage from the battery below the reference voltage, comparator 52 turns transistor 54 "off" which turns relay coil 60 "off", thereby disconnecting the battery from the load by disconnecting relay switch 24.

To prevent chatter in relay coil 60 and relay switch 24, thyristor 68 acts as a fault indicator and is latched "on" by capacitor 70 when the load is disconnected. Measured battery voltage, however, tends to increase when the load is removed because of the voltage drop caused by connector wiring, ignition switch and relay contacts. Accordingly, thyristor 68, when "on", places resistor 76 in parallel with resistor 50 and alters the voltage divider circuit, thereby increasing the value of the battery voltage required to restore the load connection.

Thyristor 68 is reset (and the voltage divider is restored to its initial value) by action of transistor 80 which shorts resistor 76 and thyristor 68 when the load is reconnected by starting the vehicle and engaging the alternator. By shorting resistor 76 and thyristor 68, the current in thyristor 68 is reduced to zero or nearly zero, thereby unlatching thyristor 76. In the preferred embodiment, battery saver circuit 10 is set to disconnect the battery from the load when the battery voltage falls to twelve (12) volts. Thyristor 68 resets this voltage upward, requiring the battery voltage to be thirteen (13) volts to reconnect the load until the circuit is reset by starting the engine.

The reference voltage provided by zener diode 14 is adjustable to account for the line series voltage drop caused by different load currents. This adjustment in the reference voltage is provided by op-amps 18 and 20 and is proportional to the current drawn by the load. Op-amp 20 is a current to voltage converter which converts the current in fuse 26 to a voltage. The voltage from op-amp 20 is then fed to op-amp 18 which is configured as an inverting amplifier. As the voltage output of op-amp 18 decreases, the value of the voltage divider formed by resistors 44 and 46 changes as resistor 40 is placed in parallel with resistor 46. Altering the characteristics of the voltage divider formed by resistors 44 and 46 alters the reference voltage generated by zener diode 14.

Various applications including different makes and models of vehicles with various battery and load conditions can be accommodated by battery saver circuit 10. These variations can be accounted for by varying the gain factors of op-amps 18 and 20. Varying the gain factors is accomplished simply by changing resistors 30, 32, 36, 38, and/or 40.

While the invention has been shown and described with particular reference to a preferred embodiment, it will be understood by those skilled in the art that various changes in form and detail may be made therein without departing from the spirit and scope of the invention as defined by the appended claims.

What is claimed:

1. A circuit for monitoring a voltage associated with a battery connected across a load and ensuring that the voltage does not fall below a predetermined minimum comprising:
   a) a programmable reference voltage generator providing a reference voltage which can be varied to account for variations in the load;

b) a transfer function generator electrically connected to the programmable reference voltage generator which varies the reference voltage supplied by the programmable reference voltage generator with variations in current supplied by the battery;

c) a comparator electrically connected to the programmable voltage generator and the battery;

d) a relay electrically connected to the comparator such that the relay disconnects the battery from the load when the comparator determines that the reference voltage is greater than the voltage associated with the battery; and e) a fault indicator which raises the voltage associated with the battery necessary to reconnect the load, thereby preventing chatter in the relay.

2. A circuit as defined in claim 1 further comprising a status indicator to provide a visible status indication of the circuit.

3. A circuit as defined in claim 2 wherein the status indicator is a dual output light emitting diode.

4. A circuit as defined in claim 1 wherein the fault indicator is reset when the battery is recharged.

5. A circuit as defined in claim 1 wherein the transfer function generator includes:

(i) a current to voltage converter which converts the current supplied by the battery into a voltage; and (ii) an inverting amplifier electrically connected to the current to voltage converter which varies the reference voltage supplied by the programmable reference voltage generator.

6. A circuit as defined in claim 1 wherein the programmable reference voltage generator is a programmable zener diode.

7. A circuit for monitoring a voltage associated with a battery connected across a load and ensuring that the voltage does not fall below a predetermined minimum comprising:

a) a zener diode for providing a reference voltage which can be varied to account for variations in a load;

b) a voltage to current converter electrically connected to the battery and converting a current drawn by the load to a control voltage;

c) an amplifier electrically connected between the voltage to current converter and the zener diode which varies the reference voltage supplied by the zener diode to compensate for variations in the current drawn by the load;

d) a comparator having first and second inputs and an output, the first input electrically connected to the reference voltage provided by the zener diode and the second input electrically connected to the voltage associated with the battery;

f) a relay electrically connected to the output of the comparator such that the relay disconnects the battery from the load when the comparator determines that the reference voltage is greater than the voltage associated with the battery; and g) a thyristor which latches "on" when the battery is disconnected from the load and raises the voltage associated with the battery necessary to reconnect the battery to the load.

8. A circuit as defined in claim 7 further comprising a light emitting diode which indicates status of the circuit.

9. A circuit as defined in claim 7 wherein the thyristor is unlatched and the voltage required to reconnect the battery to the load is reset when the battery is recharged by starting an alternator.

* * * * *